(12) United States Patent
Kasahara

(10) Patent No.: US 12,483,021 B2
(45) Date of Patent: Nov. 25, 2025

(54) PROTECTIVE CIRCUIT AND SWITCH CONTROL DEVICE

(71) Applicant: ADVANTEST Corporation, Tokyo (JP)

(72) Inventor: Kiyotaka Kasahara, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 52 days.

(21) Appl. No.: 18/558,285

(22) PCT Filed: Apr. 28, 2022

(86) PCT No.: PCT/JP2022/019403
§ 371 (c)(1),
(2) Date: Oct. 31, 2023

(87) PCT Pub. No.: WO2023/007897
PCT Pub. Date: Feb. 2, 2023

(65) Prior Publication Data
US 2024/0223179 A1 Jul. 4, 2024

(30) Foreign Application Priority Data
Jul. 30, 2021 (JP) ................................. 2021-126000

(51) Int. Cl.
*H02H 5/04* (2006.01)
*G01R 1/20* (2006.01)
(Continued)

(52) U.S. Cl.
CPC ............. *H02H 5/042* (2013.01); *G01R 1/203* (2013.01); *H03K 17/0822* (2013.01); *H03K 2017/0806* (2013.01)

(58) Field of Classification Search
CPC ....... H03K 2017/0806; H03K 17/0822; H02H 5/042; G01R 1/203
See application file for complete search history.

(56) References Cited

U.S. PATENT DOCUMENTS 4,705,412 A * 11/1987 Matsumoto ............ H02H 5/042
400/54
10,037,859 B2 * 7/2018 Jin ......................... H01H 37/32
(Continued)

FOREIGN PATENT DOCUMENTS

CN 209805409 U 12/2019
DE 10121881 A1 11/2002
(Continued)

OTHER PUBLICATIONS

Translation of JP 0513686A. Jan. 22, 1993. (Year: 1993).*
(Continued)

*Primary Examiner* — Thienvu V Tran
*Assistant Examiner* — Christopher J Clark
(74) *Attorney, Agent, or Firm* — Osha Bergman Watanabe & Burton LLP

(57) ABSTRACT

A protective circuit that protects a semiconductor switch includes a group of terminals consisting of either one or more input terminals and two or more output terminals, or one or more output terminals and two or more input terminals, a first resistive circuit, connected to one of the terminals, comprising a resistor having a first temperature coefficient of resistance; and a second resistive circuit, connected to another one of the terminals, comprising a resistor having a second temperature coefficient of resistance different in temperature characteristics from the first temperature coefficient of resistance. The protective circuit is electrically connected to a control terminal of the semiconductor switch, and shuts off a passing current of the semiconductor switch when a temperature of the semiconductor switch is equal to or higher than a current shut-off temperature.

5 Claims, 7 Drawing Sheets

(51) Int. Cl.
  *H03K 17/08*   (2006.01)
  *H03K 17/082*  (2006.01)

(56) References Cited

U.S. PATENT DOCUMENTS

| | | |
|---|---|---|
| 2011/0084679 A1 | 4/2011 | Balakrishnan et al. |
| 2011/0194223 A1* | 8/2011 | Kang .................... H02H 5/042 |
| | | 361/106 |
| 2014/0167115 A1 | 6/2014 | Obu et al. |
| 2015/0130438 A1 | 5/2015 | Kang et al. |
| 2018/0183393 A1 | 6/2018 | Kasahara |
| 2020/0039379 A1 | 2/2020 | Schlosser |
| 2020/0144808 A1* | 5/2020 | Yamane ................. H02H 5/042 |
| 2022/0069815 A1* | 3/2022 | Minagawa ......... H03K 17/0828 |

FOREIGN PATENT DOCUMENTS

| | | | | |
|---|---|---|---|---|
| JP | 0513686 A | * | 1/1993 | ............. H01L 27/04 |
| JP | 2005051873 A | | 2/2005 | |
| JP | 2010239138 A | | 10/2010 | |
| JP | 2011091759 A | | 5/2011 | |
| JP | 2012243801 A | | 12/2012 | |
| JP | 2014120668 A | | 6/2014 | |
| JP | 2018110293 A | | 7/2018 | |
| JP | 6823454 B2 | | 2/2021 | |

OTHER PUBLICATIONS

Risbud, Dilip M., "Analog and digital cell library in High Voltage GaN—on—Si Schottky Power Semiconductor Technology," WiPD. 4, Fayetteville, AR, USA, 2016 (6 pages).

International Search Report issued in corresponding International Application No. PCT/JP2022/019403, dated Aug. 2, 2022, with translation (6 pages).

Office Action issued in Japanese Application No. 2021-126000; Dated Feb. 4, 2025 (11 pages).

* cited by examiner

PROTECTIVE CIRCUIT AND SWITCH CONTROL DEVICE

CROSS-REFERENCE TO RELATED APPLICATIONS

The present application claims priority to Japanese Patent Application No. 2021-126000, filed Jul. 30, 2021. The contents of this application are incorporated herein by reference in their entirety.

BACKGROUND

Technical Field

The present invention relates to a protective circuit that protects a semiconductor switch, and a switch control device.

Description of the Related Art

In the related art, a PTAT-based temperature shut-off circuit suggested for a high-voltage GaN power high electron mobility transistor (HEMT) is known (for example, Non-Patent Document 1). For example, the temperature shut-off circuit described in Non-Patent Document 1 senses a temperature of the GaN power HEMT and generates and outputs a voltage on which the temperature is reflected. A voltage corresponding to a temperature generated in the GaN power HEMT is input to a comparator, the input voltage and a fixed reference voltage are compared with each other, and when reaching a predetermined temperature condition, a flag is turned on to shut off the GaN power HEMT.

Non-Patent Document

Non-Patent Document 1: D. Risbud, K. Pedrotti, "Analog and digital cell library in high voltage GaN-on-Si Schottky power semiconductor technology", WiPD. 4, Fayetteville, AR, USA, (2016)

However, in a case of mounting the temperature shut-off circuit on a substrate, a circuit structure becomes complicated, and an area occupied by the temperature shut-off circuit on the substrate is large.

SUMMARY

One or more embodiments provide a protective circuit capable of preventing overheating with a simple circuit configuration.

A protective circuit of Aspect 1 of one or more embodiments is a protective circuit that protects a semiconductor switch. The protective circuit includes: a plurality of input and output terminals in which at least any one of an input side and an output side is configured as a plurality of terminals; a first resistive circuit that is connected to any one of the plurality of input and output terminals, and includes a resistor having a first temperature coefficient of resistance; and a second resistive circuit that is connected to another one of the plurality of input and output terminals, and includes a resistor having a second temperature coefficient of resistance different in temperature characteristics from the first temperature coefficient of resistance. The protective circuit is electrically connected to a control terminal of the semiconductor switch, and shuts off a passing current of the semiconductor switch in a case where a temperature of the semiconductor switch is equal to or higher than a predetermined temperature.

Aspect 2 of one or more embodiments is the protective circuit according to Aspect 1, in which characteristics of the first temperature coefficient of resistance and characteristics of the second temperature coefficient of resistance become characteristics of any one of positive, negative, and flat in characteristics of a resistance with respect to a temperature, and are different from each other.

Aspect 3 of one or more embodiments is the protective circuit according to Aspect 1 or Aspect 2, in which the first resistive circuit includes a first load resistor and a resistor for a first current source, the second resistive circuit includes a second load resistor and a resistor for a second current source, and a temperature coefficient of resistance of one resistor among the first load resistor, the resistor for the first current source, the second load resistor, and the resistor for the second current source is different from a temperature coefficient of resistance of the other resistors.

Aspect 4 of one or more embodiments is the protective circuit according to Aspect 3, in which switching elements included in the first resistive circuit and the second resistive circuit are formed from a compound semiconductor, and the one resistor and any one resistor among the other resistors are formed from a nitride material.

Aspect 5 of one or more embodiments is the protective circuit according to any one of Aspects 1 to 4, in which a voltage difference between an output voltage of the first resistive circuit and an output voltage of the second resistive circuit varies depending on a temperature.

Aspect 6 of one or more embodiments is a switch control device, including: the protective circuit according to any one of Aspects 1 to 5; and a voltage selection circuit that selects a threshold voltage for switching On and Off of the semiconductor switch, in which the protective circuit is connected to the voltage selection circuit, and the voltage selection circuit sets the threshold voltage so that the semiconductor switch is turned off regardless of the magnitude of an input voltage of the switch control device in a case where a temperature of the semiconductor switch is equal to or higher than the predetermined temperature.

Aspect 7 of one or more embodiments is a switch control device, including: the protective circuit according to any one of Aspects 1 to 5; and a variable resistor configured to adjust the predetermined temperature.

According to one or more embodiments, the protective circuit includes: a plurality of input and output terminals in which at least any one of an input side and an output side is configured as a plurality of terminals; a first resistive circuit that is connected to any one of the plurality of input and output terminals, and includes a resistor having a first temperature coefficient of resistance; and a second resistive circuit that is connected to another one of the plurality of input and output terminals, and includes a resistor having a second temperature coefficient of resistance different in temperature characteristics from the first temperature coefficient of resistance. The protective circuit is electrically connected to a control terminal of the semiconductor switch, and shuts off a passing current of the semiconductor switch in a case where a temperature of the semiconductor switch is equal to or higher than a predetermined temperature. According to this, overheating of the semiconductor switch can be prevented with a simple circuit configuration.

DESCRIPTION OF THE EMBODIMENTS

Hereinafter, embodiments will be described with reference to the accompanying drawings.

Figure 1:
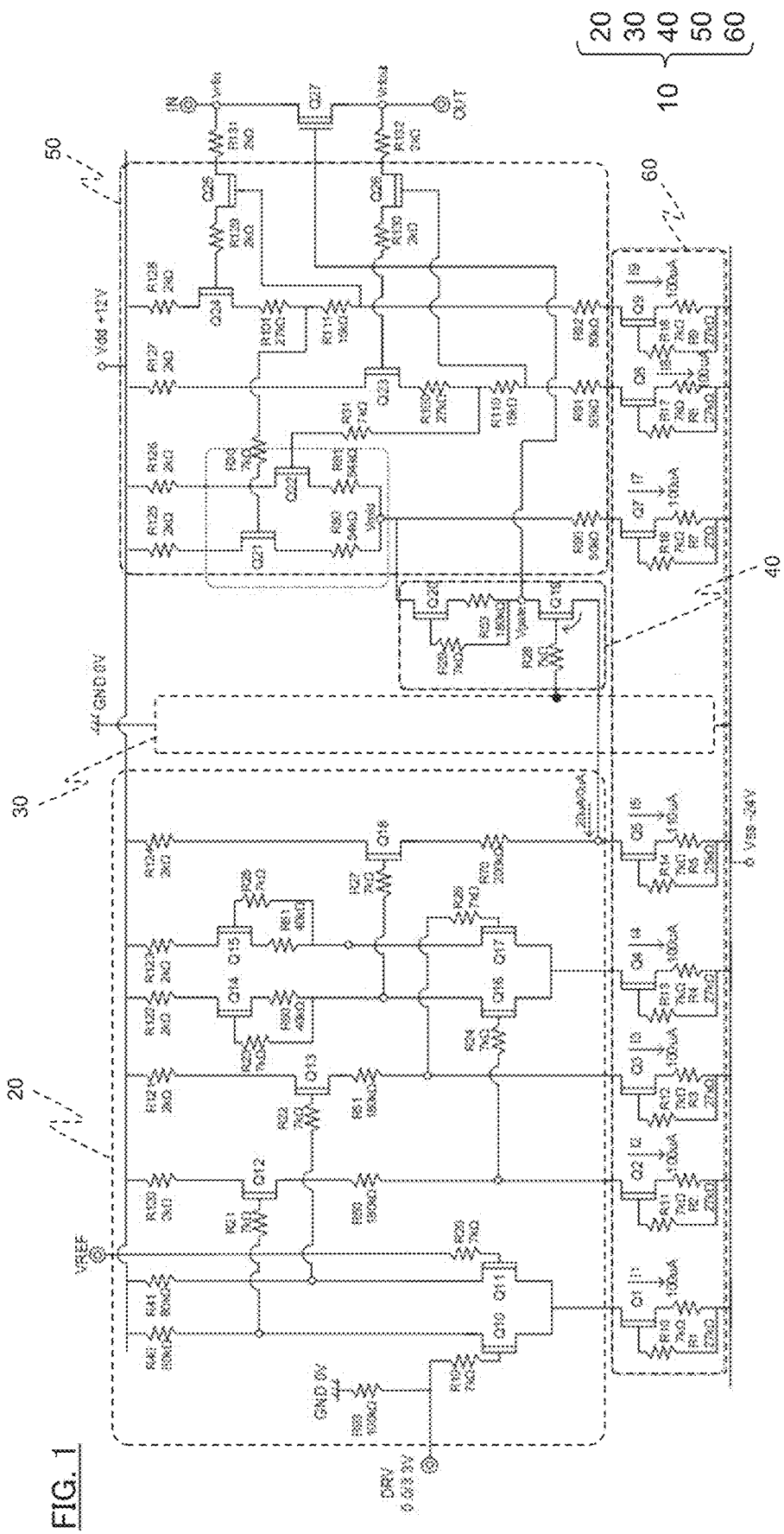
FIG. 1 is a circuit diagram of a switch control device according to one or more embodiments.

A switch control device 10 according to one or more embodiments will be described with reference to FIG. 1. FIG. 1 is a circuit diagram of the switch control device 10 according to one or more embodiments. Note that, a circuit configuration and a connection type of an input signal amplification circuit 20 and the like included in the switch control device 10 illustrated in FIG. 1 are illustrative only, and other circuit configurations may be employed. In addition, a resistance value, a voltage value, and a current value illustrated in FIG. 1 are illustrative only.

The switch control device 10 is a control circuit configured to switch On and Off of a main switch Q27 on the basis of an input signal. The input signal is a switching signal that is input from the outside, and a waveform of the input signal is an On/Off waveform of a high level (On-voltage) and a low level (Off-voltage). The switch control device 10 amplifies a voltage of an input signal in order to switch On/Off of the main switch Q27 with a voltage difference of the input signal, and shifts a voltage level (converts the voltage level). The voltage difference of the input signal corresponds to a difference between a high-level voltage representing an On-state, and a low-level voltage representing an Off-state.

The main switch Q27 is a GaN semiconductor switch. When an input voltage that is equal to or more than a gate voltage selected by a gate voltage selection circuit 40 is input to the switch control device 10, the main switch Q27 is turned on, and a passing current flows between a drain and a source of the main switch Q27.

The switch control device 10 includes an input signal amplification circuit 20, a protective circuit 30, the gate voltage selection circuit 40, a tracking circuit 50, and a current source 60. A switching element (switching transistor) included in each circuit is formed from, for example, a compound semiconductor such as a GaN semiconductor.

Here, element characteristics of the compound semiconductor will be described while being compared with element characteristics of a silicon process. The compound semiconductor has excellent characteristics in dielectric breakdown strength, thermal conductivity, operability in a high-temperature state, and the like, and has excellent physical characteristics as a material. On the other hand, with regard to a compound semiconductor, for example, a GaN-based process (manufacturing process and versatility for the market) is less advanced in comparison to an Si-based process, and thus a variation of an element is large, and an element size is larger in comparison to an Si-based process. Furthermore, in the compound semiconductor, a voltage reference and temperature characteristics cannot be easily obtained. Therefore, in the related art, in a case where the circuit to be protected from overheating is constituted by a compound semiconductor, a circuit configuration is likely to be complicated, and a simple circuit configuration and a reduction in area are difficult to be accomplished due to complexity of the circuit configuration and a size of the compound semiconductor element itself.

The switch control device 10 according to one or more embodiments is a monolithic control circuit (IC circuit) containing a compound semiconductor to switch On and Off of the main switch, and has a circuit configuration as illustrated in FIG. 1. According to this, the switch control device 10 can suppress thermal runaway and overcurrent according to overheating with a simple circuit configuration and a reduced area while using a compound semiconductor in which a variation is large. Note that, the circuit configuration illustrated in FIG. 1 is illustrative only, and a power supply voltage, a resistance, or a connection type of respective circuit elements can be changed in correspondence with a voltage range of an input signal or an operation voltage range of the main switch.

As illustrated in FIG. 1, the input signal amplification circuit 20 is provided on an input side of the switch control device 10. The input signal amplification circuit 20 includes a unilateral differential input circuit and amplifies a difference with respect to an input signal. The input signal amplification circuit 20 includes a gate resistor, a voltage dividing resistor, and the like in addition to the unilateral differential input circuit. An input signal ($V_{in}$) is a switching signal in which 0 V is set as a low level, and +3.3 V is set as a high level. The unilateral differential input circuit includes a plurality of symmetrically connected switching elements Q10 and Q11, and resistors R40 and R41. A drain terminal of the switching element Q10 is connected to a reference power supply through the resistor R40, and a drain terminal of the switching element Q11 is connected to a power supply through the resistor R41. A gate terminal of the switching element Q10 is connected to an input terminal through a gate resistor R19, and a gate terminal of the switching element Q11 is connected to the reference power supply through a voltage-dividing resistor R20. Characteristics of the switching element Q10 and characteristics of the switching element Q11 are the same as each other. An input signal is input to the gate terminal (control terminal) of the switching element Q10, and a reference voltage is input to the gate terminal of the switching element Q11. A source terminal of the switching element Q10 and a source terminal of the switching element Q11 are commonly connected to one current source.

As illustrated in FIG. 1, the input signal amplification circuit 20 includes a differential amplification circuit, a voltage dividing resistor, and the like in addition to the unilateral differential input circuit. An output line of the input signal amplification circuit 20 is connected to a source terminal of a switching element Q19 included in the gate voltage selection circuit 40. In addition, in the unilateral differential input circuit and the differential amplification circuit of the input signal amplification circuit 20, the switching elements Q10 and Q11, and switching elements Q16 and Q17, which are connected in pairs, are commonly connected to one current source, respectively.

The protective circuit 30 is electrically connected to the gate terminal of the main switch Q27 through the gate voltage selection circuit 40. The protective circuit 30 is a circuit that shuts off a passing current of the main switch Q27 in a case where a temperature of the main switch Q27 is equal to or higher than a predetermined temperature (current shut-off temperature). The protective circuit 30 is connected to a gate terminal of the switching element Q19 included in the gate voltage selection circuit 40.

Figure 2:
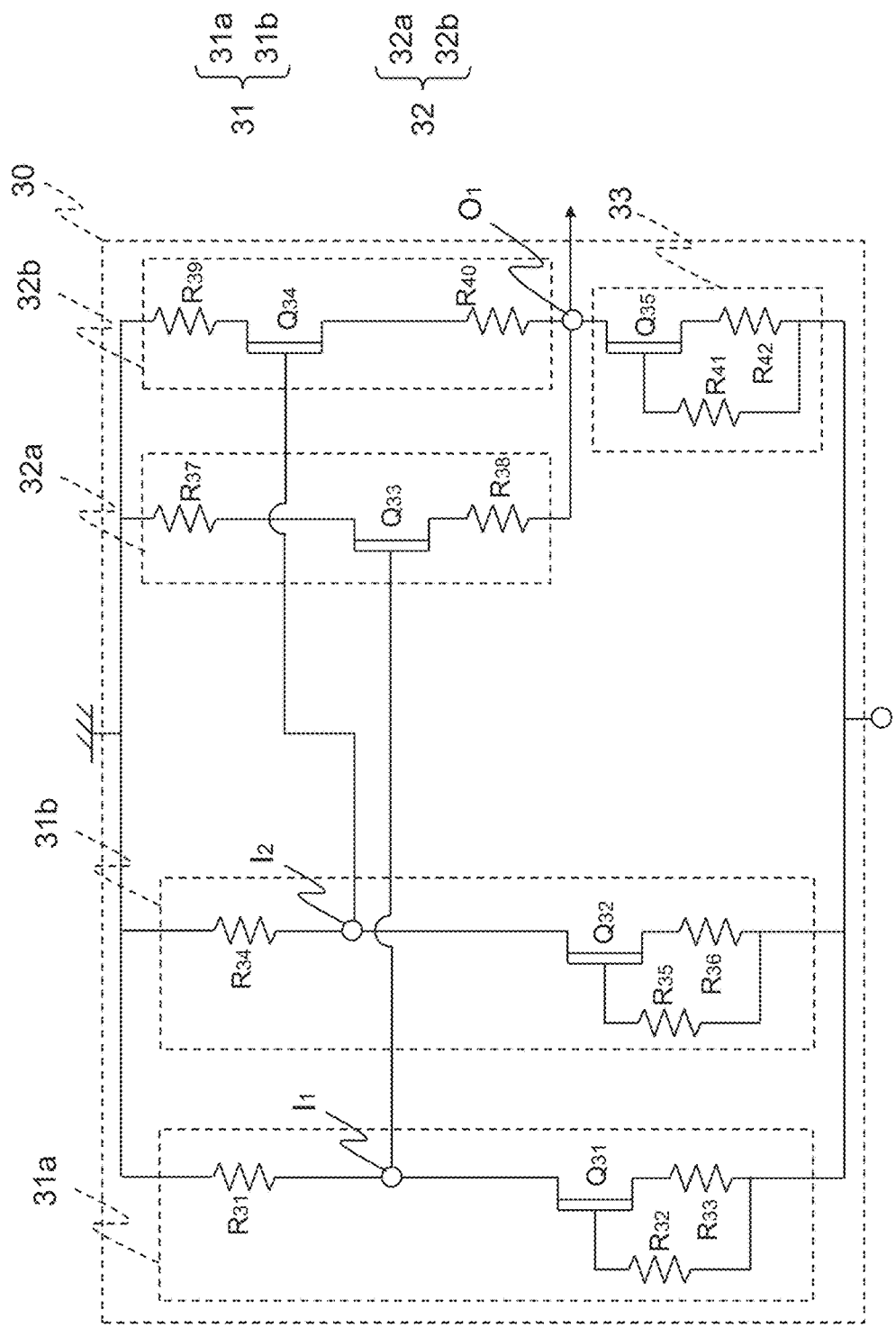
FIG. 2 is a circuit diagram of a protective circuit illustrated in FIG. 1.

FIG. 2 is a circuit diagram of the protective circuit 30. The protective circuit 30 illustrated in FIG. 2 is connected to a dotted-line portion in FIG. 1. The protective circuit 30 includes a first level shifter circuit 31, a second level shifter circuit 32, a current source 33, input terminals $I_1$ and $I_2$, and an output terminal $O_1$. The protective circuit 30 includes input and output terminals ($I_1$, $I_2$, and $O_1$) in which at least any one of an input side and an output side is configured as a plurality of terminals. In the example illustrated in FIG. 2, the input terminals ($I_1$ and $I_2$) are a plurality of terminals. In the example illustrated in FIG. 2, the output terminal $O_1$ is a common terminal. Note that, the input and output terminals of the protective circuit 30 are not limited to the example illustrated in FIG. 2, and the output terminal may be configured as a plurality of terminals.

The first level shifter circuit 31 includes a first resistive circuit 31a in which a load resistor R31 and a current source are connected in series, and a second resistive circuit 31b in which a load resistor R34 and a current source are connected in series. A connection point between the load resistor R31 and the current source corresponds to the input terminal $I_1$, and a connection point between the load resistor R34 and the current source corresponds to the input terminal $I_2$. The current source included in the first resistive circuit 31a includes a switching element Q31 and resistors (resistors for a current source) R32 and R33. The resistor R32 is connected between a gate and a source of the switching element Q31. The resistor R33 is connected to the resistor R32 in parallel, and is connected to a source terminal of the switching element Q31. The current source included in the second resistive circuit 31b includes a switching element Q32 and resistors (resistors for a current source) R35 and R36. A connection type of the current source included in the second resistive circuit 31b is similar to a connection type of the current source included in the first resistive circuit 31a.

A connection point between the load resistor R31 and the current source included in the first resistive circuit 31a is connected to a gate terminal of a switching element Q33. A connection point between the load resistor R34 and the current source included in the second resistive circuit 31b is connected to a gate terminal of a switching element Q34.

The second level shifter circuit 32 includes a first resistive circuit 32a in which load resistors R37 and R38, and the switching element Q33 are connected in series, and a second resistive circuit 32b in which load resistors R39 and R40, and the switching element Q34 are connected in series. Input terminals of the second level shifter circuit 32 are the gate terminals of the switching elements Q33 and Q34, and correspond to the input terminals $I_1$ and $I_2$. A drain terminal of the switching element Q33 is connected to the load resistor R37, and a source terminal of the switching element Q33 is connected to the load resistor R38. In addition, a drain terminal of the switching element Q34 is connected to the load resistor R39, and a source terminal of the switching element Q34 is connected to the load resistor R40. Low-voltage side terminals of the resistor R38 and the resistor R40 are connected to the output terminal ($O_1$).

The current source 33 is connected to a low-voltage side of the second level shifter circuit 32, and becomes a current source for causing a constant current to flow to the second level shifter circuit 32. The current source 33 includes a switching element Q35 and resistors R41 and R42. The resistor R41 is connected between a gate and a source of the switching element Q35. The resistor R42 is connected to the resistor R41 in parallel, and is connected to a source terminal of the switching element Q35.

As illustrated in FIG. 1, the gate voltage selection circuit 40 is connected between the protective circuit 30 and the main switch Q27. The gate voltage selection circuit 40 is a circuit that selects a threshold voltage (gate threshold voltage) for turning on the main switch Q27. The main switch Q27 is turned on or off with a level of an input voltage based on the input signal ($V_{in}$) on the basis of a voltage selected by the gate voltage selection circuit 40.

The gate voltage selection circuit 40 includes the switching element Q19, a switching element Q20, and resistors R28, R29, and R53. A drain terminal of the switching element Q19 is connected to the resistors R29 and R53, and the gate terminal of the switching element Q19 is connected to the output terminal ($O_1$) of the protective circuit 30 through the resistor R28, and the source terminal of the switching element Q19 is connected to the current source 60. The resistor R29 is connected between a gate and a source of the switching element Q20. The resistor R53 is connected to the resistor R29 in parallel, and is connected to the source terminal of the switching element Q20. The drain terminal of the switching element Q19 is connected to the resistors R29 and R53. The drain terminal of the switching element Q19 is connected to the gate terminal of the main switch Q27.

The tracking circuit 50 is a circuit configured to stabilize a gate voltage by causing an input voltage to follow a gate voltage. Circuit elements included in the tracking circuit 50 and a circuit configuration are as shown in FIG. 1.

The current source 60 includes a plurality of constant-current circuits. The plurality of constant-current circuits is connected to low-current sides of the input signal amplification circuit 20 and the tracking circuit 50, respectively, and become current sources for causing a constant current to flow to respective circuits. Circuit elements of each of the constant-current circuits and a circuit configuration are as shown in FIG. 1.

Next, description will be given of a combination of the resistors used in the protective circuit 30 and resistive circuits included in the protective circuit 30.

The first resistive circuit 31a and the second resistive circuit 31b are level shifter circuits using two types of resistors. The first resistive circuit 31a and the second resistive circuit 31b include a resistor having a different temperature coefficient of resistance among the load resistor R31, the resistors R32 and R33 used in the current source, the load resistor R34, and the resistors R35 and R36 used in the current source. In other words, a temperature coefficient of resistance of at least one resistor of the load resistor R31, the resistors R32 and R33 used in the current source, the load resistor R34, and the resistors R35 and R36 used in the current source, which are included in the first resistive circuit 31a and the second resistive circuit 31b, is different from a temperature coefficient of resistance of the other resistors.

Figure 3:
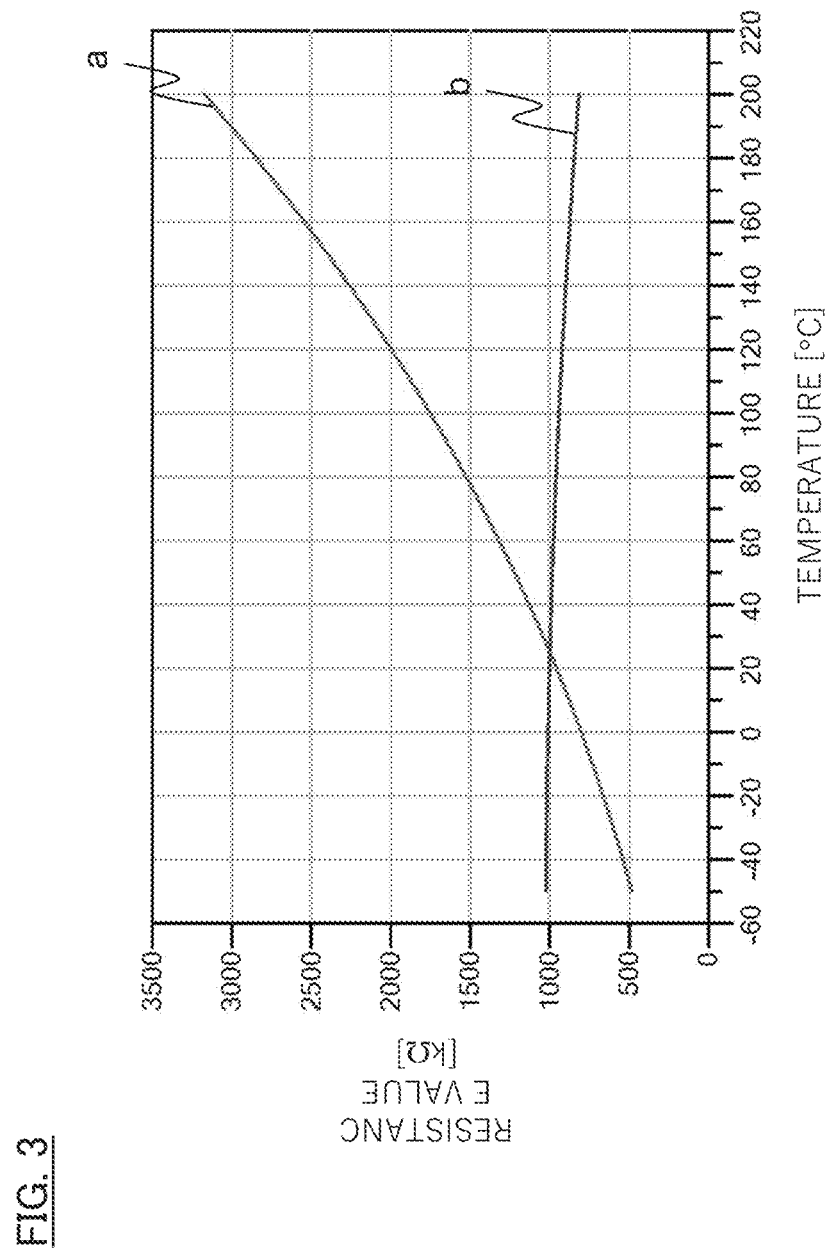
FIG. 3 is a graph illustrating temperature characteristics of a typical resistor and a resistor formed from a nitride material.

FIG. 3 illustrates temperature characteristics of a typical resistor and a resistor using a nitride material. In FIG. 3, a graph a shows characteristics of the typical resistor and a graph b shows characteristics of the resistor using the nitride material. The typical resistor is a resistor (Epi-R) using a sheet resistance of a GaN-on-SiC epitaxial substrate. The resistor using the nitride material is a resistor (ZrN-R) using a zirconium nitride thin film. The nitride material may be titanium nitride (TiN), zirconium nitride (ZrN), tantalum nitride (TaN), or hafnium nitride (HfN) in addition to the zirconium nitride.

As illustrated in FIG. 3, the temperature characteristics of the typical resistor have a positive inclination with respect to a temperature. On the other hand, the temperature characteristics of the resistor (hereinafter, also referred to as a nitride resistor) using the nitride material have a negative inclination with respect to a temperature. That is, the typical resistor and the nitride resistor have temperature coefficients of resistance different from each other. In one or more embodiments, as the resistors included in the first level shifter circuit 31, two types of resistors are used. Among the resistors included in the first level shifter circuit 31, one resistor is set as one of the typical resistor and the nitride resistor, and the other resistor is set as the other of the typical resistor and the nitride resistor. The two types of resistors may be different types between the plurality of resistors included in the first resistive circuit 31a, or may be different types between the resistors included in the first resistive circuit 31a, and the resistors included in the second resistive circuit 31b.

Figure 4A:
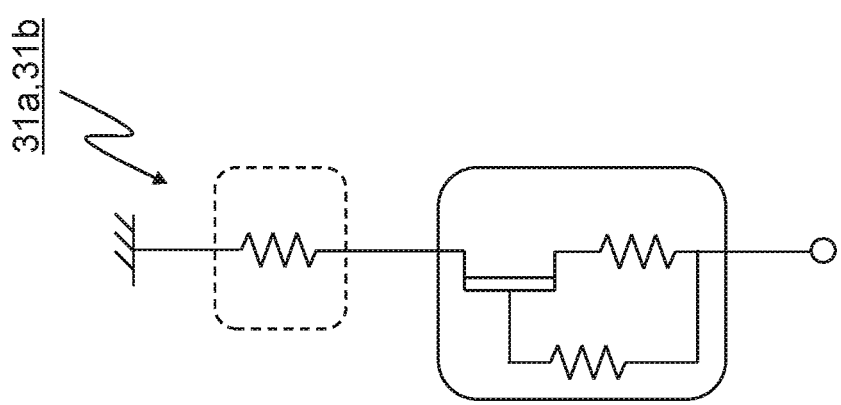
FIG. 4A is a circuit diagram explaining a combination of a level shifter circuit using two types of resistors.
Figure 4B:
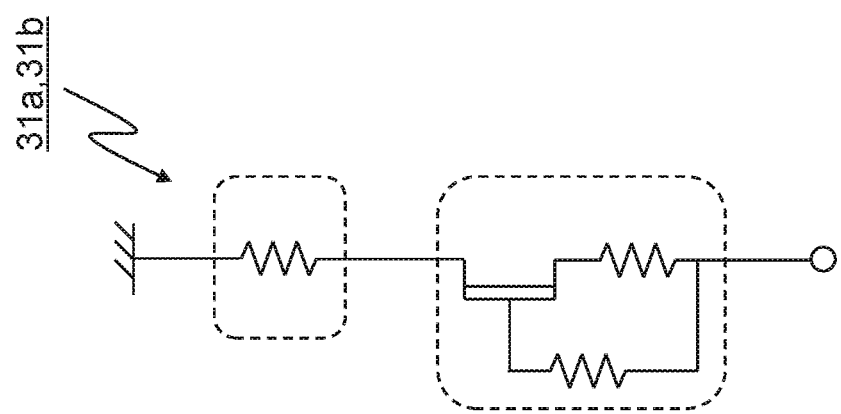
FIG. 4B is a circuit diagram explaining a combination of a level shifter circuit using two types of resistors.
Figure 4C:
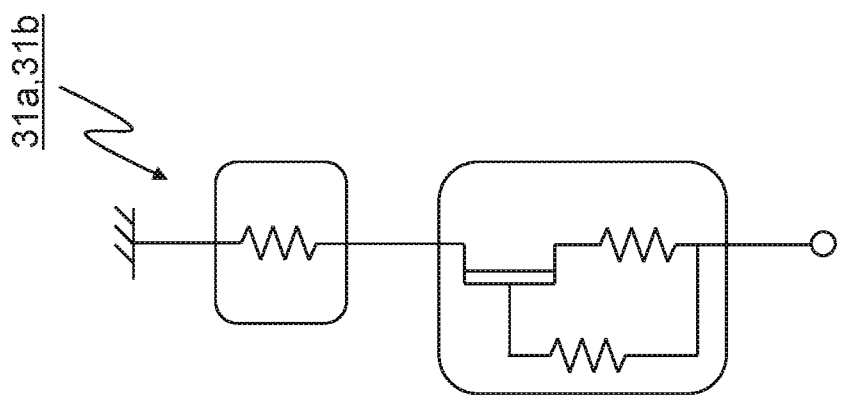
FIG. 4C is a circuit diagram explaining a combination of a level shifter circuit using two types of resistors.
Figure 4D:
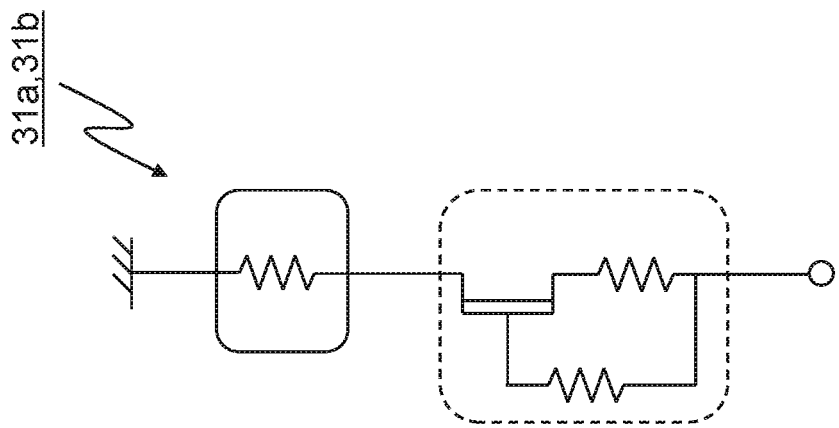
FIG. 4D is a circuit diagram explaining a combination of a level shifter circuit using two types of resistors.

FIGS. 4A to 4D are a circuit diagram explaining a combination of a level shifter circuit using two types of resistors. The typical resistor is used in a dotted-line frame, and the nitride resistor is used in a solid-line frame. As illustrated in FIG. 4A, a resistive circuit of Case 1 uses the typical resistor as the load resistor, and uses the nitride resistor as the resistors included in the current source. As illustrated in FIG. 4B, a resistive circuit of Case 2 uses the typical resistor as the load resistor, and uses the typical resistor as the resistors included in the current source. As illustrated in FIG. 4C, a resistive circuit of Case 3 uses the nitride resistor as the load resistor, and uses the nitride resistor as the resistors included in the current source. As illustrated in FIG. 4D, a resistive circuit of Case 4 uses the nitride resistor as the load resistor, and uses the typical resistor as the resistors included in the current source.

In Case 1 and Case 4, since different types of resistors are used in one resistive circuit, characteristics of a temperature coefficients of resistance of the resistors become characteristics of any one of positive, negative, and flat in characteristics of a resistance with respect to a temperature, and become different from each other. For example, in the first resistive circuit 31a of Case 1, a temperature coefficients of resistance of the resistor R31 becomes positive characteristics, and a temperature coefficients of resistance of the resistors R32 and R33 becomes negative or flat characteristics. Note that, the flat characteristics are characteristics in which a coefficient of resistance becomes approximately constant in a predetermined temperature range.

Figure 5:
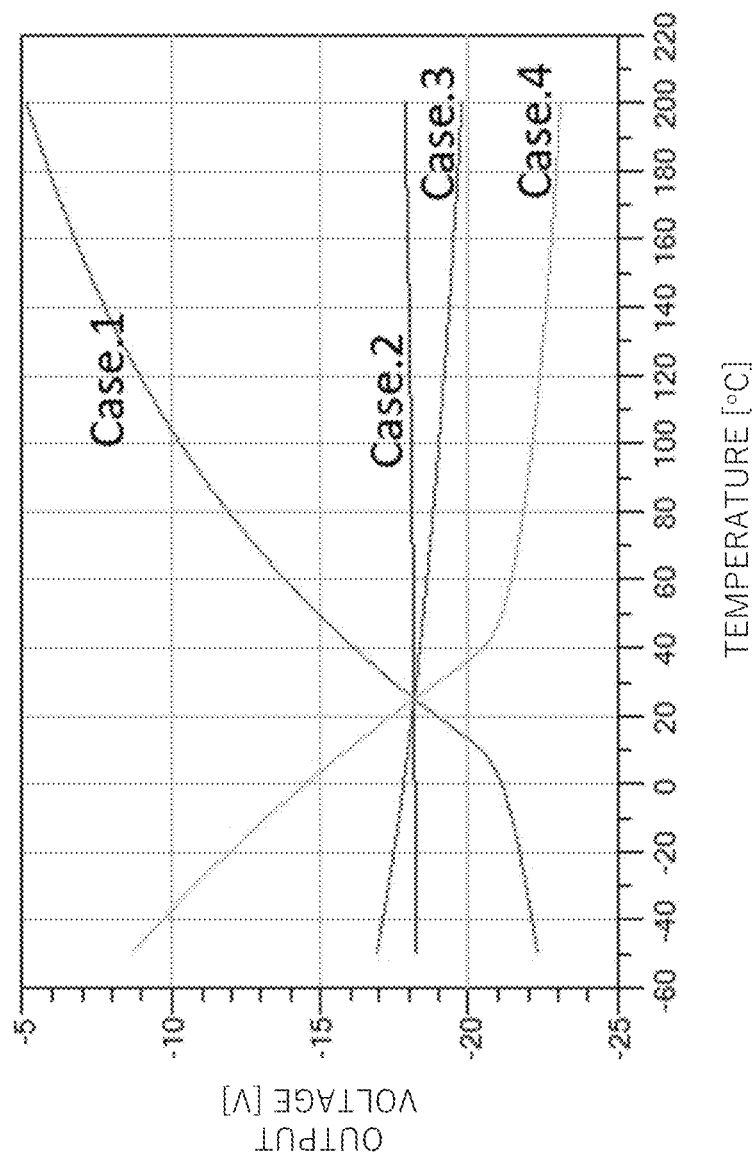
FIG. 5 is a graph illustrating output voltage-temperature characteristics of Cases 1 to 4 illustrated in FIGS. 4A to 4D.

FIG. 5 is a graph illustrating output voltage-temperature characteristics of Cases 1 to 4 illustrated in FIGS. 4A to 4D. As illustrated in FIG. 5, the output voltage-temperature characteristics of the resistive circuit included in the level shifter circuit are different depending on a type of a resistor that is used. In addition, in one or more embodiments, the level shifter circuit is constituted by combining Cases 1 to 4, and a circuit, which shuts off a passing current when a temperature of the main switch Q27 becomes equal to or higher than a predetermined setting temperature (current shut-off temperature) by using a difference in an output voltage, is realized.

Specifically, for example, the circuits of Case 1 are used in the first resistive circuit 31a, and the circuits of Case 4 are used in the second resistive circuit 31b. In a case where the level shifter circuit is constituted by a combination of Case 1 and Case 4, when a temperature reaches approximately 25° C., the higher the temperature is, the greater a difference in an output voltage of the resistive circuits is. That is, the difference in the output voltage of the resistive circuits varies depending on a temperature. In a case where a setting temperature at which the passing current is shut off is set to 100° C., as illustrated in FIG. 5, an output voltage of the resistive circuit in Case 1 becomes approximately −10 V, and an output voltage of the resistive circuit of Case 4 becomes approximately −22 V. In addition, in a case where a difference in the output voltage occurs at the time of the setting temperature (100° C.), a gate threshold voltage adjusting function by the gate voltage selection circuit 40 operates by a voltage output from the protective circuit 30 to the gate voltage selection circuit 40, and the main switch Q27 is turned off regardless of the magnitude of the input voltage (Vi) of an input signal. In addition, a temperature of the main switch Q27 and a temperature of the protective circuit 30 have a correlation, and thus when the temperature of the main switch Q27 rises, a temperature of the resistors included in the protective circuit 30 rises in the same manner as in the temperature of the main switch Q27. Circuit parameters included in the protective circuit 30 and the gate voltage selection circuit 40 are set so that the main switch Q27 is compulsorily turned off in a case where the temperature of the resistors included in the protective circuit 30 becomes equal to or higher than the setting temperature (100° C.) due to temperature rising of the main switch Q27.

Figure 6A:
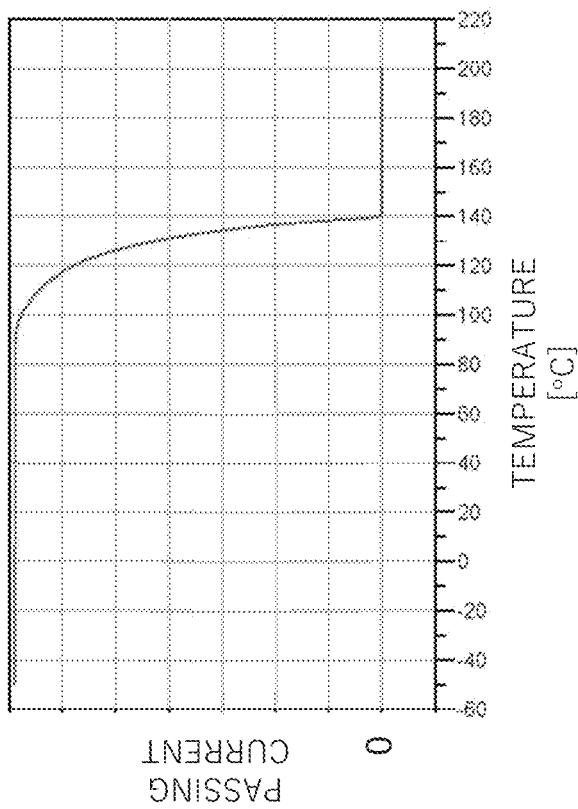
FIG. 6A is a graph illustrating temperature characteristics of a switch control device in one or more embodiments.
Figure 6B:
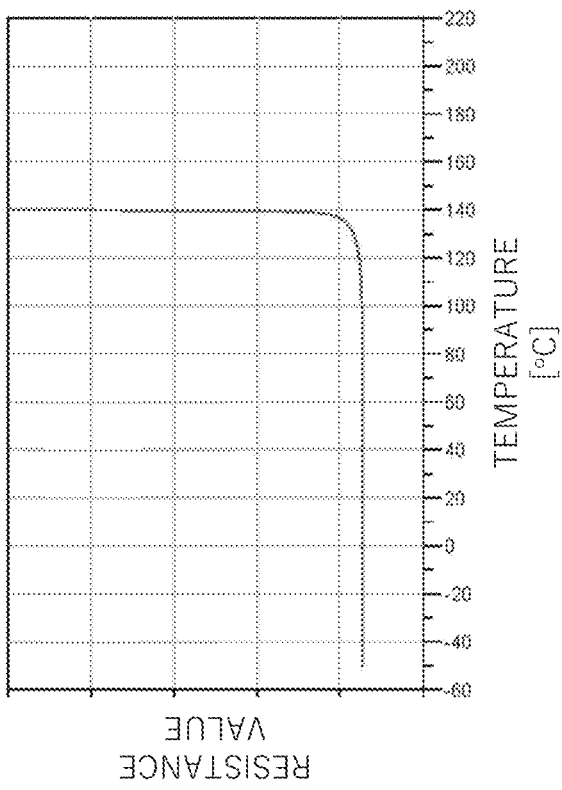
FIG. 6B is a graph illustrating temperature characteristics of a switch control device in one or more embodiments.

FIGS. 6A and 6B are a graph illustrating temperature characteristics of a switch control device in one or more embodiments. FIG. 6A illustrates voltage-temperature characteristics of an On-resistance of the main switch Q27, and FIG. 6B illustrates passing current-temperature characteristics of the main switch Q27. As illustrated in FIG. 6A, when the temperature becomes equal to or higher than 100° C., the On-resistance of the main switch Q27 steeply rises. In addition, when the temperature becomes equal to or higher than 100°, the passing current steeply drops and becomes a zero ampere. According to this, when the temperature of the main switch Q27 becomes equal to or higher than the setting temperature)(100° ° C., the main switch Q27 is turned off regardless of the magnitude of an input voltage of an input signal, and the passing current is shut off.

Note that, in one or more embodiments, the first resistive circuit 32a and the second resistive circuit 32b included in the second level shifter circuit 32 may be set as circuits using two types of resistors. For example, one resistor among the resistors R37 to R40 may be set as a typical resistor, and the other resistors may be set as nitride resistors. In addition, two types of resistors may be used between the load resistor included in the first resistive circuit 32a and the resistors used in the current source 33. Two types of resistors may be used between the load resistor included in the second resistive circuit 32a and the resistors used in the current source 33.

As described above, the protective circuit 30 according to one or more embodiments includes the plurality of input and output terminals ($I_1$, $I_2$, and $O_1$) in which at least one of an input side and an output side is configured as a plurality of terminals, the first resistive circuits 31a and 32a which are connected to any one of the plurality of input and output terminals ($I_1$, $I_2$, and $O_1$) and include resistors having a first temperature coefficient of resistance, and the second resistive circuits 31b and 32b which are connected to another one of the plurality of input and output terminals ($I_1$, $I_2$, and $O_1$) and include resistors having a second temperature coefficient of resistance different in temperature characteristics from the first temperature coefficient of resistance. The protective circuit 30 is electrically connected to a control terminal (gate terminal) of the main switch Q27, and shuts off the passing current of the main switch Q27 in a case where a temperature of the main switch Q27 is equal to or higher than a predetermined temperature (current shut-off temperature). According to this, overheating can be prevented with a simple circuit configuration. In addition, a fail-safe function (over heat protection and overcurrent protection) can be realized with a reduced area. In addition, an overheating prevention circuit can be realized with a plurality of types of resistors different in a temperature coefficient of resistance.

In addition, in the protective circuit 30 according to one or more embodiments, characteristics of the first temperature coefficient of resistance and characteristics of the second temperature coefficient of resistance become characteristics of any one of positive, negative, and flat in characteristics of a resistance with respect to a temperature, and are different from each other. According to this, an overheating prevention circuit can be realized with a plurality of types of resistors different in a temperature coefficient of resistance.

In addition, in the protective circuit 30 according to one or more embodiments, the first resistive circuits 31a and 32a include the resistors R31 and R37 (corresponding to a "load resistor" of one or more embodiments), and the resistors R32, R33, R41, and R42 (corresponding to "resistors for a current source" of one or more embodiments), the second resistive circuits 31b and 32b include the resistors R34 and R39 (corresponding to a "load resistor" of one or more embodiments) and the resistors R35, R36, R41, and R42 (corresponding to "resistors for a current source" of one or more embodiments), a temperature coefficient of resistance of one resistor among the resistors R31 and R37, the resistors R32, R33, R41, and R42, the resistors R34 and R39, and the resistors R35, R36, R41, and R42 is different from a temperature coefficient of resistance of the other resistors. According to this, an overheating prevention circuit can be realized with a plurality of types of resistors different in the temperature coefficient of resistance. Note that, in one or more embodiments, a resistive circuit including the first resistive circuit 32a and the current source 33 corresponds to "first resistive circuit" of one or more embodiments, and a resistive circuit including the second resistive circuit 32b and the current source 33 corresponds to "second resistive circuit" of one or more embodiments.

In addition, in the protective circuit 30 according to one or more embodiments, switching elements included in the first resistive circuits 31a and 32a, and the second resistive circuits 31b and 32b are formed from a compound semiconductor, and the one resistor and any one resistor among the other resistors are formed from a nitride material. According to this, an overheating prevention circuit can be realized with a plurality of types of resistors different in a temperature coefficient of resistance.

In addition, in the protective circuit 30 according to one or more embodiments, a voltage difference between an output voltage of the first resistive circuits 31a and 32a, and an output voltage of the second resistive circuits 31b and 32b varies depending on a temperature. According to this, a current shut-off temperature can be arbitrarily set, and thus expandability of a circuit can be secured.

In addition, the switch control device 10 according to one or more embodiments includes the gate voltage selection circuit 40 that selects a threshold voltage for switching On and Off of the main switch Q27, the protective circuit 30 is connected to the gate voltage selection circuit 40, and the gate voltage selection circuit 40 sets the threshold voltage so that the main switch Q27 is turned off regardless of the magnitude of an input voltage of the switch control device 10 in a case where a temperature of the main switch Q27 is equal to or higher than the predetermined temperature. According to this, overheating can be prevented with a simple circuit configuration. In addition, a fail-safe function (over heat protection and overcurrent protection) can be realized with a reduced area.

Figure 7:
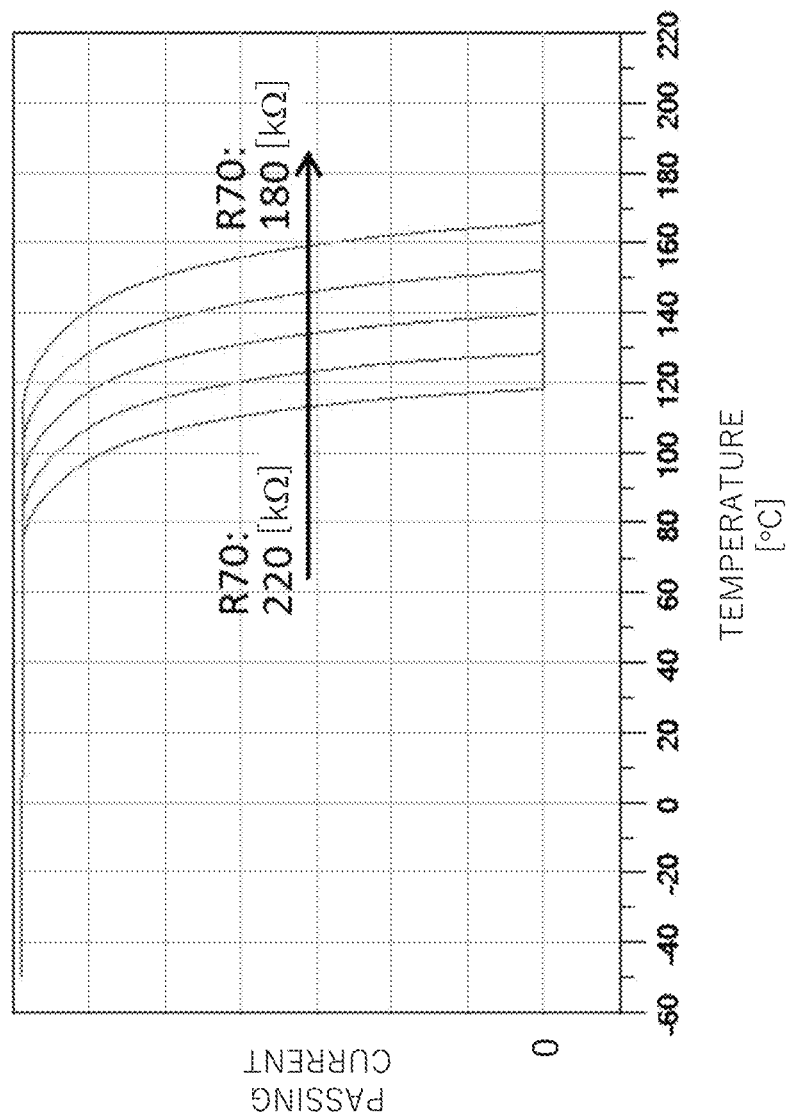
FIG. 7 illustrates passing current temperature characteristics of a main switch in a case where a resistance value of a resistor is changed.

Note that, as a modification example of one or more embodiments, the resistor R70 included in the input signal amplification circuit 20 may be set as a variable resistor, and a temperature at which the passing current is shut off may be arbitrarily set by changing a resistance value of the resistor R70. FIG. 7 illustrates passing current-temperature characteristics of the main switch Q27 in a case where the resistance value of the resistor R70 is caused to vary. As illustrated in FIG. 7, in a case where the resistance value of the resistor R70 is set to be high (for example, 220 kΩ), the passing current, when the current shut-off temperature of the main switch Q27 is approximately 120° C., becomes zero. In addition, as the resistance value of the resistor R70 is lowered, the current cut-off temperature becomes higher, and when the resistance value of the resistor R70 is set to 180 (kΩ), the current shut-off temperature of the main switch Q27 becomes approximately 165° C. In this manner, the current shut-off temperature of the main switch Q27 can be set to any value by changing circuit parameters of the resistor R70. The switch control device 10 relating to the modification example includes a variable resistor configured to adjust the current shut-off temperature. According to this, the current shut-off temperature can be arbitrarily set by changing the circuit parameters. Note that, the resistor configured to adjust the current shut-off temperature is not limited to the resistor R70, and may be another resistor included in the switch control device 10.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF REFERENCE NUMERALS

10 SWITCH CONTROL DEVICE
20 INPUT SIGNAL AMPLIFICATION CIRCUIT
30 PROTECTIVE CIRCUIT
31 FIRST LEVEL SHIFTER CIRCUIT
   31a FIRST RESISTIVE CIRCUIT
   31b SECOND RESISTIVE CIRCUIT
32 SECOND LEVEL SHIFTER CIRCUIT
   32a FIRST RESISTIVE CIRCUIT
   32b SECOND RESISTIVE CIRCUIT
33 CURRENT SOURCE
40 GATE VOLTAGE SELECTION CIRCUIT
50 TRACKING CIRCUIT
60 CURRENT SOURCE

The invention claimed is:

1. A protective circuit that protects a semiconductor switch, comprising:
   one output terminal and two input terminals;
   a first resistive circuit, connected to one of the two input terminals, comprising:
      a first load resistor; and
      a first current source including a first switching element and a first resistor, wherein between the first load resistor and the first resistor, one has a first temperature coefficient of resistance; and
   a second resistive circuit, connected to another one of the two input terminals, comprising:
      a second load resistor; and
      a second current source including a second switching element and a second resistor, wherein between the second load resistor and the second resistor, one has a second temperature coefficient of resistance different in temperature characteristics from the first temperature coefficient of resistance, wherein
   the protective circuit:
      is electrically connected to a control terminal of the semiconductor switch, and
      shuts off a passing current of the semiconductor switch when a temperature of the semiconductor switch is equal to or higher than a current shut-off temperature,
   among the first load resistor, the first resistor, the second load resistor, and the second resistor, one has a different temperature coefficient of resistance compared to the others,
   the first switching element and the second switching element include a compound semiconductor, and
   among the first load resistor, the first resistor, the second load resistor, and the second resistor, the one having the different temperature coefficient of resistance and one of the others include a nitride material.

2. The protective circuit according to claim 1, wherein the temperature characteristics of the first temperature coefficient of resistance and the temperature characteristics of the second temperature coefficient of resistance are one of positive, negative, and flat.

3. The protective circuit according to claim 1, wherein a voltage difference between an output voltage of the first resistive circuit and an output voltage of the second resistive circuit varies depending on a temperature.

4. A switch control device, comprising:
   the protective circuit according to claim 1; and
   a voltage selection circuit that selects a threshold voltage for switching On and Off of the semiconductor switch, wherein
   the protective circuit is connected to the voltage selection circuit, and
   the voltage selection circuit sets the threshold voltage such that the semiconductor switch turns off regardless of magnitude of an input voltage of the switch control device when a temperature of the semiconductor switch is equal to or higher than the current shut-off temperature.

5. A switch control device, comprising:
   the protective circuit according to claim 1; and
   a variable resistor that adjusts the current shut-off temperature.

* * * * *